(12) United States Patent
Margulis

(10) Patent No.: US 11,043,357 B1
(45) Date of Patent: Jun. 22, 2021

(54) SUPPLY UNIT AND A METHOD FOR DRIVING AN ELECTRODE OF A CHARGED PARTICLE BEAM COLUMN

(71) Applicant: Applied Materials Israel Ltd., Rehovot (IL)

(72) Inventor: Pavel Margulis, Ashdod (IL)

(73) Assignee: Applied Materials Israel Ltd., Rehovot (IL)

( * ) Notice: Subject to any disclaimer, the term of this patent is extended or adjusted under 35 U.S.C. 154(b) by 15 days.

(21) Appl. No.: 16/751,039

(22) Filed: Jan. 23, 2020

(51) Int. Cl.
*H01J 37/24* (2006.01)
*H01J 37/28* (2006.01)
*H01J 37/256* (2006.01)

(52) U.S. Cl.
CPC ............ *H01J 37/24* (2013.01); *H01J 37/256* (2013.01); *H01J 37/28* (2013.01)

(58) Field of Classification Search
CPC .......... H01J 37/00; H01J 37/02; H01J 37/065; H01J 37/10; H01J 37/12; H01J 37/141; H01J 37/24; H01J 37/241; H01J 37/243; H01J 37/248; H01J 37/256; H01J 37/28

USPC ............................ 250/306, 307, 311, 396 R
See application file for complete search history.

(56) References Cited

U.S. PATENT DOCUMENTS

| 2015/0014529 A1* | 1/2015 | Nanri | H01J 37/3178 250/310 |
| 2019/0259575 A1* | 8/2019 | Sarov | H01J 37/3177 |

* cited by examiner

*Primary Examiner* — Jason L McCormack
(74) *Attorney, Agent, or Firm* — Kilpatrick Townsend & Stockton LLP

(57) ABSTRACT

A supply unit for driving an electrode of a charged particle beam column, the supply unit includes a first amplifier and a second amplifier that are configured to receive an input signal, an output of the first amplifier is coupled, via the first resistor, to a signal line of the coaxial cable, an output of the second amplifier is coupled, via the second resistor, to a main shield of the coaxial cable, one port of the first amplifier and one port of the second amplifier are coupled to a power supply return port. The signal line is configured to provide a first driving signal to an that is coupled between the signal line and the power supply return port.

12 Claims, 8 Drawing Sheets

US 11,043,357 B1

SUPPLY UNIT AND A METHOD FOR DRIVING AN ELECTRODE OF A CHARGED PARTICLE BEAM COLUMN

BACKGROUND

A charged particle beam system illuminates an object with a charged particle beam such as an electron beam or an ion beam. The charged particle beam is generated and controlled by a charged particle beam column.

The charged particle beam column may include multiple electrodes that should be fed with driving signals.

The charged particle beam system is relatively large and electrodes can be spaced apart from driving signal sources by few meters. The electrodes may receive driving signals over relatively long lines that are located in a very noisy environment.

Due to the noisy environment the long lines should be shielded—which is achieved by using coaxial cables.

A non-limiting example of an electrode is a deflecting electrode for deflecting the charged particle beam.

The deflecting electrode is used to scan a charged particle beam that illuminated the object. The scanning may involve supplying scanning voltages (from a scanning voltage supply) to a deflecting electrode. The scanning voltages may rapidly change (for example—at a rate of more than 400 volts per microsecond), and may have a dynamic range of few hundred of volts (for example—400 volts).

The deflecting electrode may have a relatively small capacitance (for example—less than 5 picofarads).

The deflecting electrode is fed by a coaxial cable that has a capacitance that may be tens time greater than the capacitance of the electrode. For example—the capacitance of the coaxial cable may be, about 160 picofarads.

The scanning voltage supply source sees a capacitive load that has a capacitance that is equal to a sum of the capacitance of the electrode and the capacitance of the coaxial cable. For example—the capacitive load may equal 5+160=165 picofarads, out of which about 97% percent is a parasitic capacitance.

Driving of a capacitive load that is mostly parasitic is inefficient, requires to use a costly scanning voltage supply source and also reduces the maximal scanning speed.

There is a growing need to provide an efficient manner of driving an electrode of a charged particle column.

SUMMARY

There may be provided a supply unit and a method for driving an electrode of a charged particle beam column.

BRIEF DESCRIPTION OF THE DRAWINGS

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

DETAILED DESCRIPTION

Figure 1:
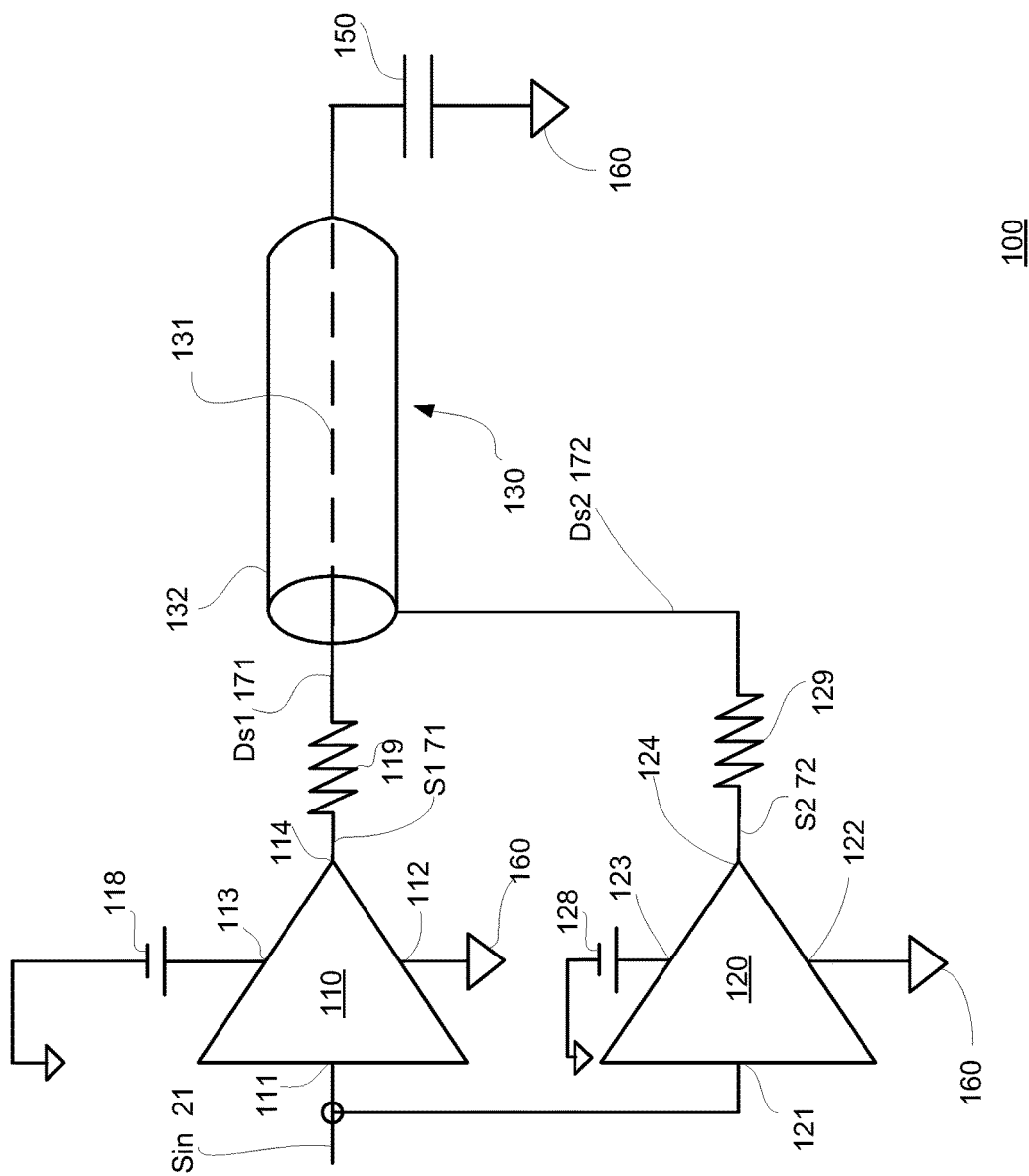
FIG. 1 illustrates an example of a supply unit.

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure Any reference in the specification to a method should be applied mutatis mutandis to a system capable of executing the method and should be applied mutatis mutandis to a computer readable medium that is non-transitory and stores instructions for executing the method.

Any reference in the specification to a system should be applied mutatis mutandis to a method that may be executed by the system and should be applied mutatis mutandis to a computer readable medium that is non-transitory and stores instructions executable by the system.

Any reference in the specification to a computer readable medium that is non-transitory should be applied mutatis mutandis to a method that may be applied when executing instructions stored in the computer readable medium and should be applied mutatis mutandis to a system configured to execute the instructions stored in the computer readable medium.

The term "and/or" means additionally or alternatively.

There is provided a supply unit for driving an electrode of a charged particle beam column, the supply unit may include a first amplifier, a first resistor, a second amplifier, a second resistor, and a coaxial cable.

The supply unit supplies to (a) a signal line of the coaxial cable and (b) a main shield of the coaxial cable substantially the same driving signals thereby virtually eliminating the capacitance of the coaxial cable.

When the electrode is a deflecting electrode then the first driving signal may have a dynamic range of at least few hundred volts and, additionally or alternatively, the first driving signal may change at a rate that exceeds few hundred volts per microsecond.

FIG. 1 is an example of supply unit 100 and an electrode 150 of a charged particle beam column.

Supply unit 100 includes first amplifier 110, second amplifier 120, and coaxial cable 130. Coaxial cable 130 includes signal line 131 and main shield 132. Signal line 131 is coupled to one end of the electrode 150. The second end of the electrode 150 is coupled to power supply return port 160.

First amplifier 110 includes first input port 111, second input port 112, third input port 113, and first output port 114.

First input port 111 receives input signal Sin 21. Second input port 112 is coupled to power supply return port 160. Third input port 113 receives a supply voltage from first supply 118. The first amplifier may include one or more supply ports for receiving one or more supply voltages from one or more voltage supplies First output port 114 is connected to one end of first resistor 119. A second end of the first resistor 119 is connected to the signal line 131.

The first amplifier 110 outputs first signal S1 71. The first signal S1 71 is converted (for example—by low pass filtering applied by a first output path that includes the first resistor 119 and the signal line 131) to a first driving signal Ds1 171 that is fed to signal line 131 and is received by electrode 150.

Second amplifier 120 includes first input port 121, second input port 122, third input port 123, and second output port 124.

First input port 121 receives input signal Sin 21. Second input port 122 is coupled to power supply return port 160. Third input port 123 receives a supply voltage from second supply 128. Second output port 124 is connected to one end of second resistor 129. A second end of the second resistor 129 is connected to the main shield 132.

The second amplifier 120 outputs second signal S2 72. The second signal S2 72 is converted (for example—by low pass filtering applied by a second output path that includes the second resistor 129 and the main shield 132) to second driving signal Ds2 172 that is fed to main shield 132.

First resistor 119 and second resistor 129 belong to the supply unit 100.

First signal S1 71 and second signal S2 72 are voltage signals.

Figure 2:
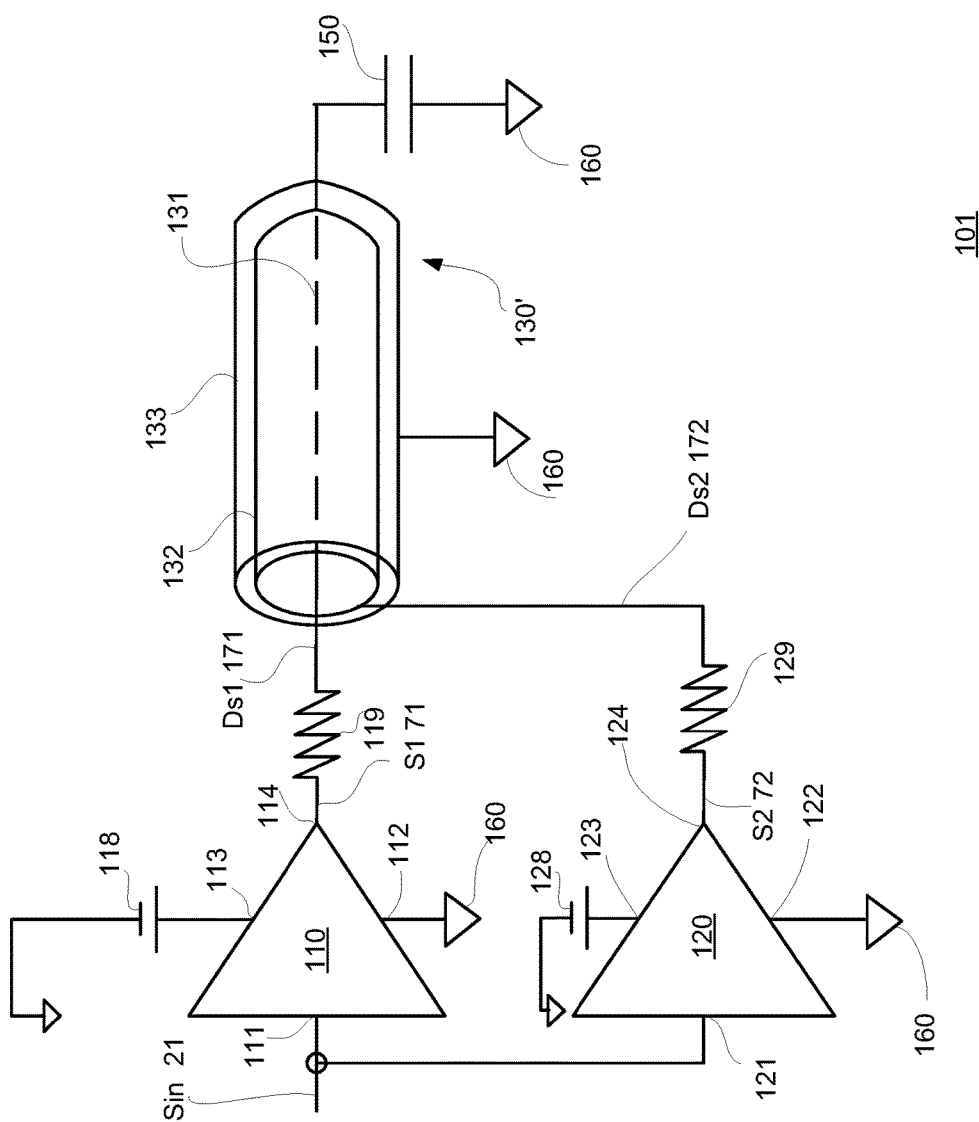
FIG. 2 illustrates an example of a supply unit.

FIG. 2 is an example of supply unit 101 and an electrode 150 of a charged particle beam column.

Supply unit 101 includes first amplifier 110, second amplifier 120, and double shielded coaxial cable 130'. Double shielded coaxial cable 130' includes signal line 131, main shield 132 and also includes additional shield 133. Signal line 131 is coupled to one end of the electrode 150. The second end of the electrode 150 is coupled to power supply return port 160.

Additional shield 133 surrounds the main shield 132, and is electrically coupled to the power supply return port 160.

The first amplifier 110 outputs first signal S1 71. The first signal S1 71 is converted to a first driving signal Ds1 171 that is fed to signal line 131.

The second amplifier 120 outputs second signal S2 72. The second signal S2 72 is converted to second driving signal Ds2 171 that is fed to main shield 132.

The introduction of additional shield 133 increases the isolation of the signal line from the environment.

On the other hand, the additional shield—and especially the capacitance between the main shield and the additional shield—may introduce various distortion between the first driving signal Ds1 and the second driving signal Ds2. The distortions mostly delays the second signal in relation to the first driving signal. The delay may reduce the cancellation of the capacitance of the coaxial cable by the provision of the first driving signal Ds1 171 and the second driving signal Ds2 172. The delay may cause the second driving signal to be equal a time shifted (delayed) first driving signal. The first resistor 119 and a capacitance (not shown) between the signal line and the ground form a first RC circuit. The second resistor 129 and a capacitance (not shown) between the main shield and the ground form a second RC circuit. The values of the first and second resistors may be selected so that the time constant of the first and second RC circuits are the same—thereby reducing and even cancelling the time shift between Ds1 and Ds2.

Figure 3:
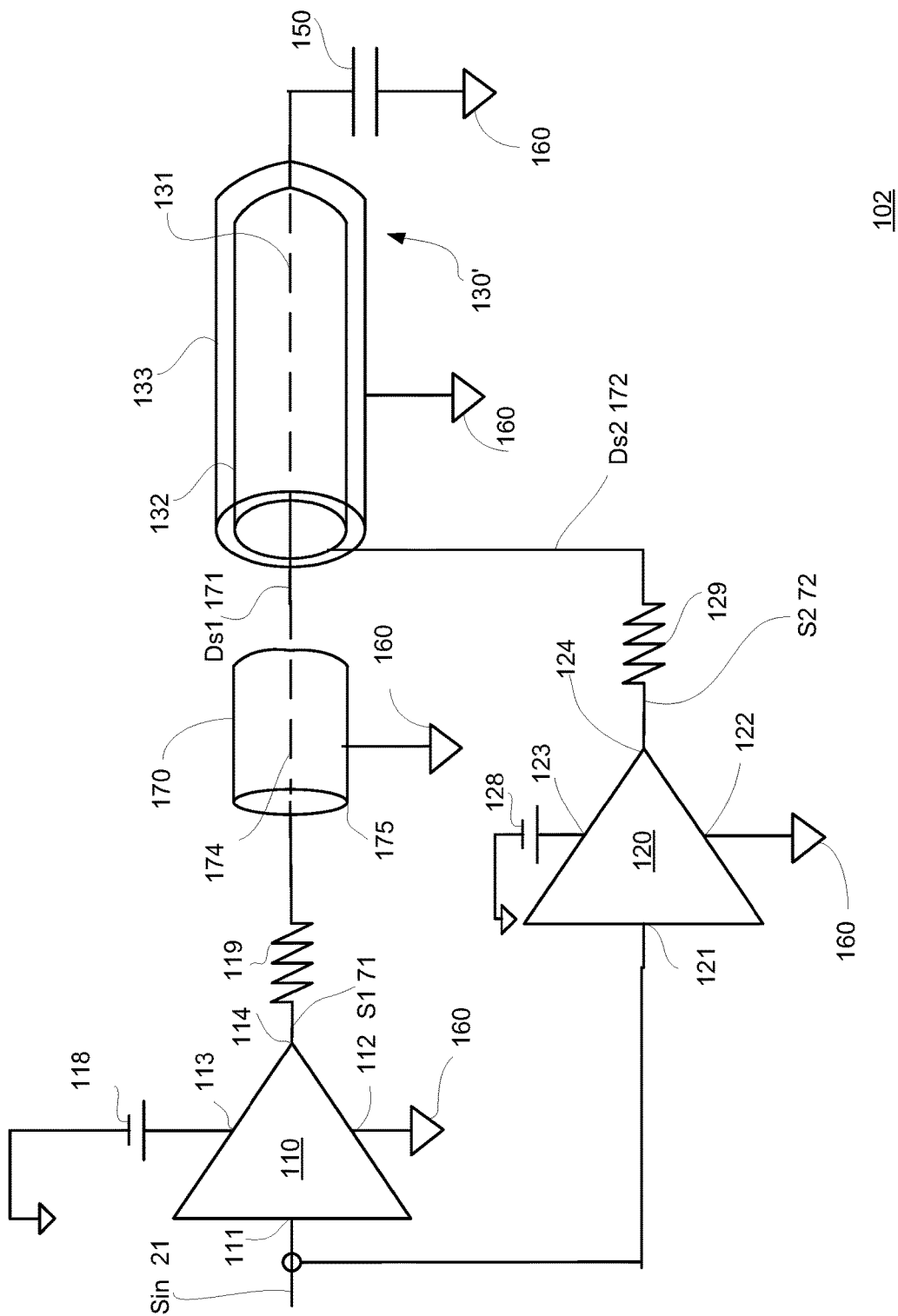
FIG. 3 illustrates an example of a supply unit.

FIG. 3 is an example of supply unit 102 and an electrode 150 of a charged particle beam column.

Supply unit 102 includes first amplifier 110, second amplifier 120, double shielded coaxial cable 130', and auxiliary coaxial cable 170 that is connected between first amplifier 110 and the double shielded coaxial cable 130'.

Auxiliary coaxial cable 170 includes auxiliary signal line 174 and auxiliary shield 175. The auxiliary shield 175 is grounded. The auxiliary signal line 174 is coupled between the first resistor 119 and the signal line 131 of the double shielded coaxial cable 130'.

The first signal S1 71 is converted to first driving signal Ds1 171 by a first output path that includes the first resistor, the auxiliary coaxial cable 170 and the capacitance of the signal line 131. The conversion may include low pass filtering and delay.

The second amplifier 120 outputs second signal S2 72. The second signal S2 72 is converted to Ds2 172 that is fed to main shield 132.

The auxiliary coaxial cable 170 is configured to compensate for the delay (between the first driving signal Ds1 171 and the second driving signal Ds2 172) that is introduced by the additional shield 133. The compensation includes delaying the first signal S1 71 to provide a first driving signal Ds1 171 that is a delayed version of the first signal S1 31.

It may be beneficial to have the delay of the second signal (delay introduced by the capacitance between the main shield 132 to the additional shield 133) to be equal to a delay of the first signal introduced by the auxiliary coaxial cable 170.

Figure 4:
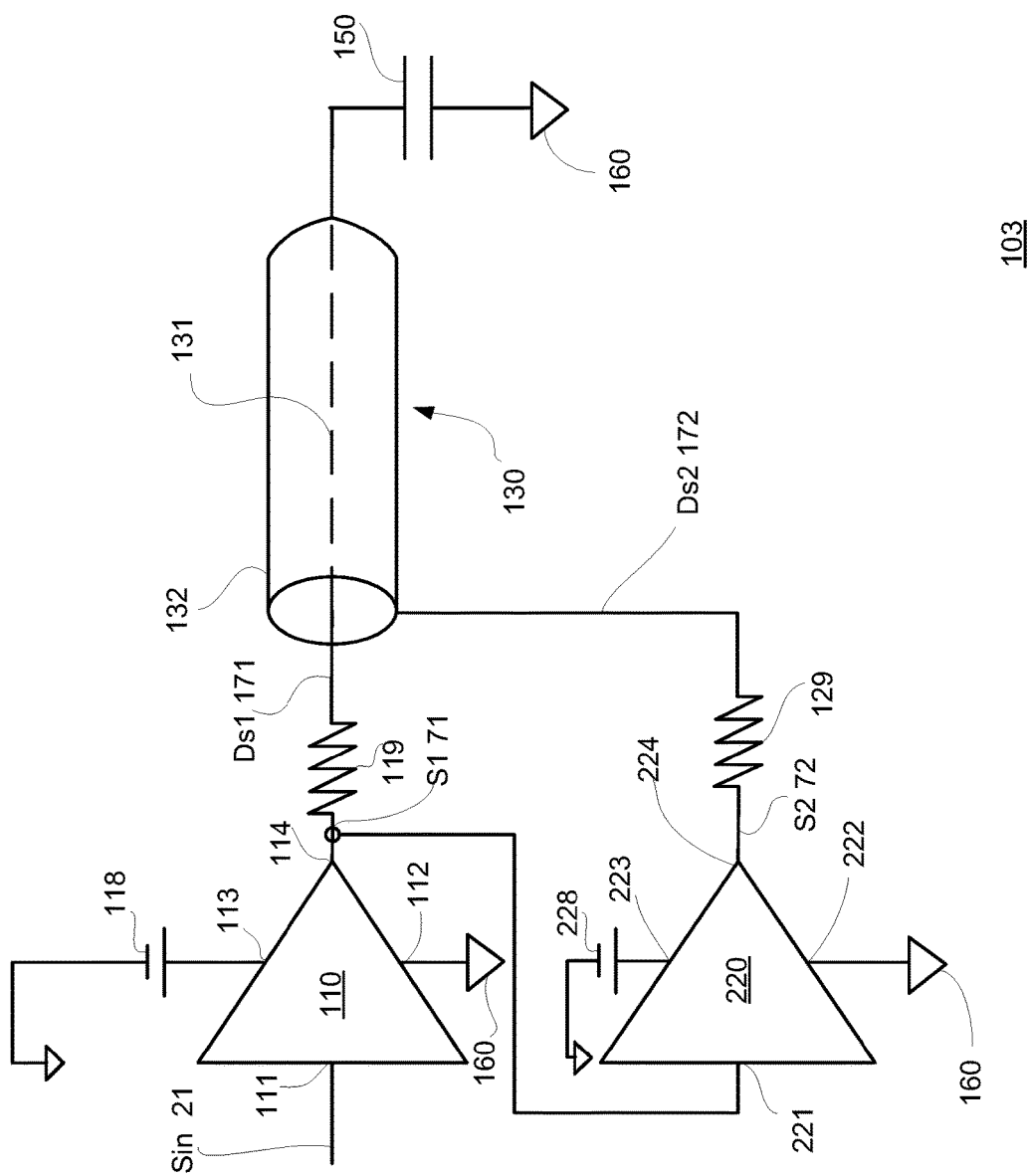
FIG. 4 illustrates an example of a supply unit.

FIG. 4 is an example of supply unit 103 and an electrode 150 of a charged particle beam column.

Supply unit 103 includes first amplifier 110, voltage buffer 220, and coaxial cable 130. Coaxial cable 130 includes signal line 131 and main shield 132. Signal line 131 is coupled to one end of the electrode 150. The second end of the electrode 150 is coupled to power supply return port 160.

First amplifier 110 includes first input port 111, second input port 112, third input port 113, and first output port 114.

First input port 111 receives input signal Sin 21. Second input port 112 is coupled to power supply return port 160. Third input port 113 receives a supply voltage from first supply 118. First output port 114 is connected to one end of first resistor 119. A second end of the first resistor 119 is connected to the signal line 131.

The first amplifier 110 outputs first signal S1 71. The first signal S1 71 is converted to a first driving signal Ds1 171 that is fed to signal line 131 and is received by electrode 150.

Voltage buffer 220 includes first input port 221, second input port 222, third input port 223, and second output port 224.

First input port 221 receives first signal S1 71 from the first output port 114 of the first amplifier 110. Second input port 222 is coupled to power supply return port 160. Third input port 223 receives a supply voltage from second supply 228. Second output port 224 is connected to one end of second resistor 229. A second end of the second resistor 129 is connected to the main shield 132.

The voltage buffer 220 outputs a second signal S2 72 that equals the first signal 51 71. The second signal S2 72 is converted to a second driving signal that is fed to main shield 132.

First resistor 119 and second resistor 129 belong to the supply unit 103.

Figure 5:
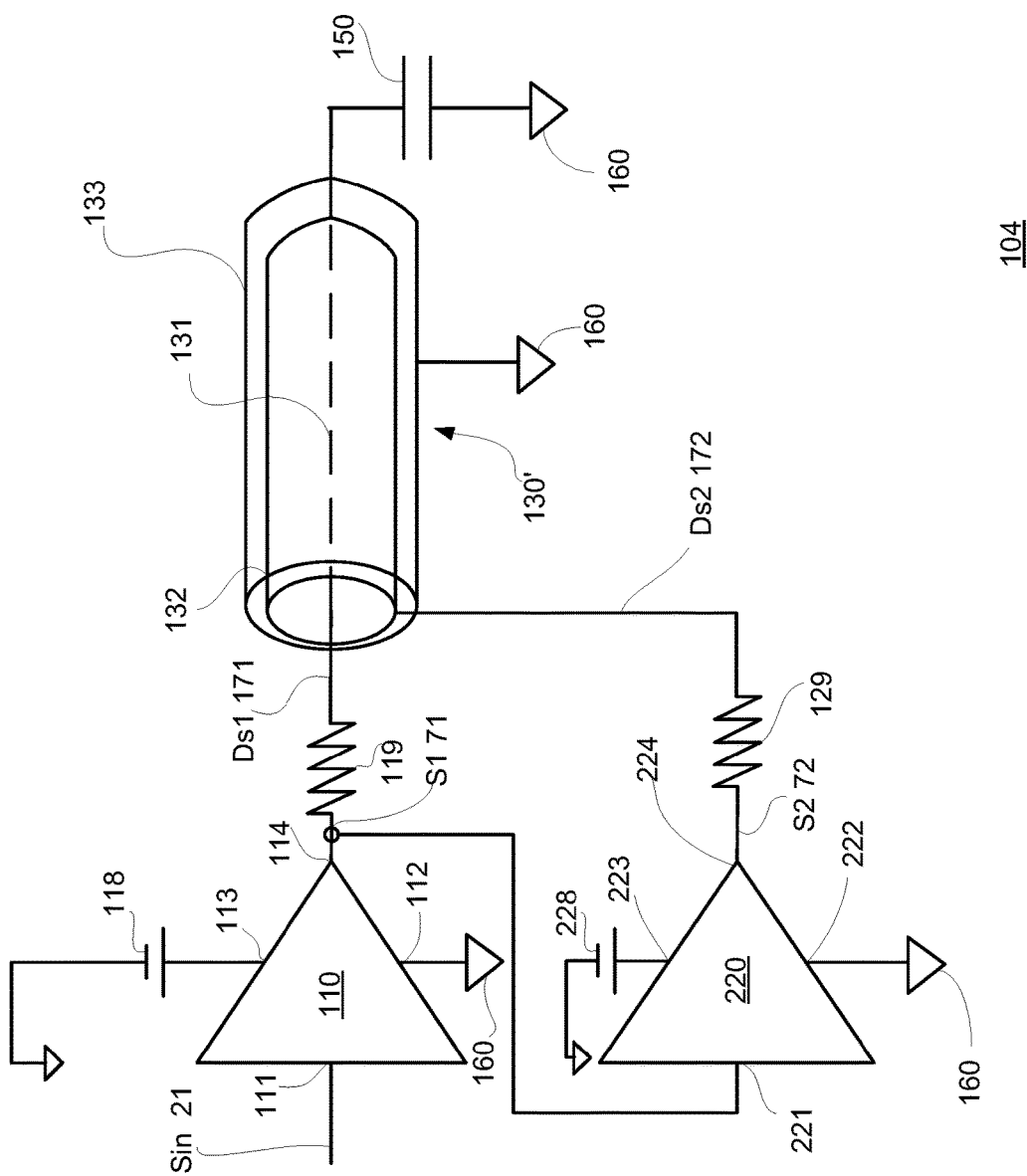
FIG. 5 illustrates an example of a supply unit.

FIG. 5 is an example of supply unit 104 and an electrode 150 of a charged particle beam column.

Supply unit 104 includes first amplifier 110, voltage buffer 220, and double shielded coaxial cable 130'. Double shielded coaxial cable 130' includes signal line 131, main shield 132 and also includes additional shield 133. Signal line 131 is coupled to one end of the electrode 150. The second end of the electrode 150 is coupled to power supply return port 160.

Additional shield 133 surrounds the main shield 132, and is electrically coupled to the power supply return port 160.

Figure 6:
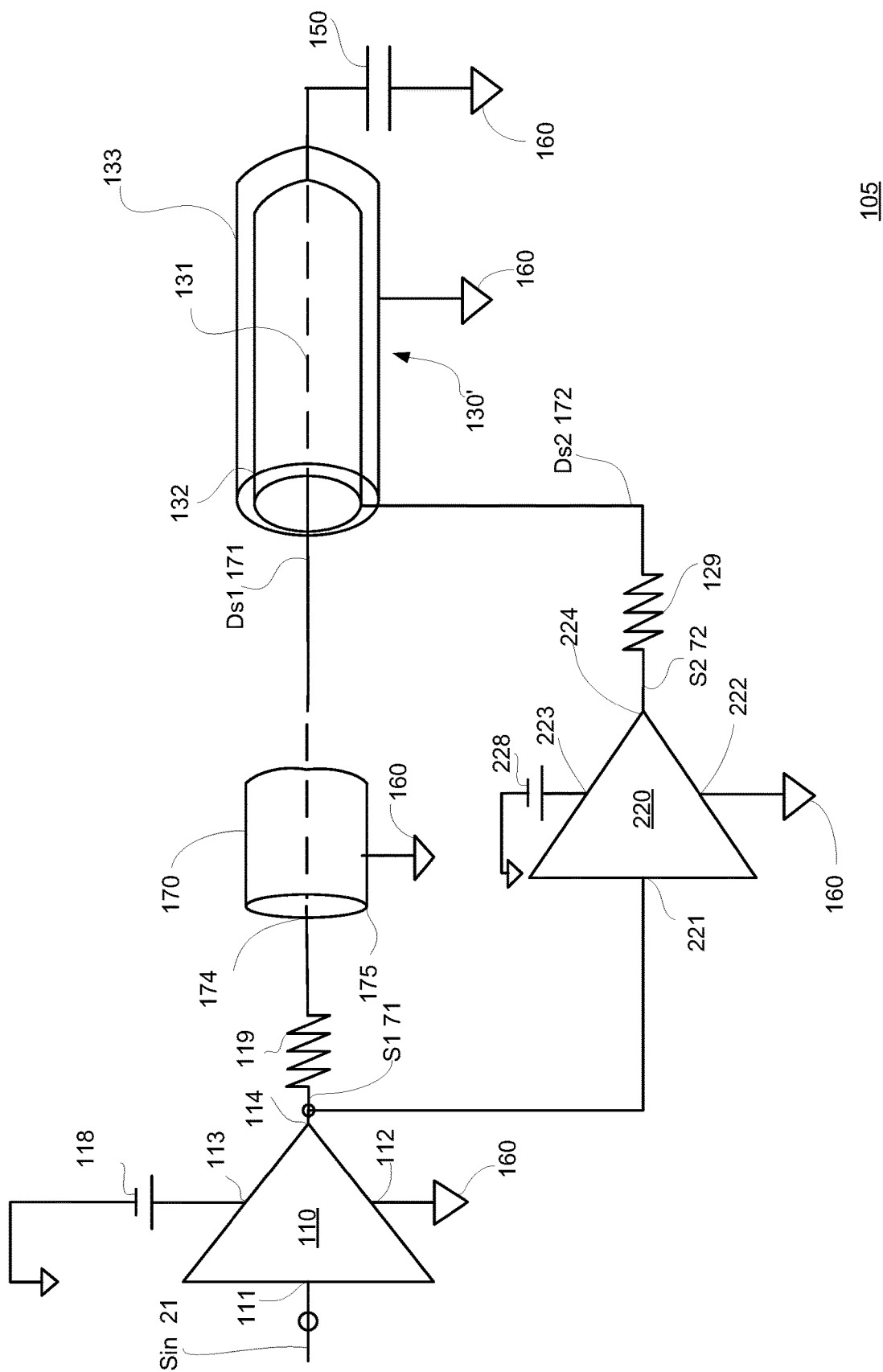
FIG. 6 illustrates an example of a supply unit.

FIG. 6 is an example of supply unit 105 and an electrode 150 of a charged particle beam column.

Supply unit 105 includes first amplifier 110, voltage buffer 220, double shielded coaxial cable 130', and auxiliary coaxial cable 170 that is connected between first amplifier 110 and the double shielded coaxial cable 130'.

Auxiliary coaxial cable 170 includes auxiliary signal line 174 and auxiliary shield 175. The auxiliary shield 175 is grounded. The auxiliary signal line 174 is coupled between the first resistor 119 and the signal line 131 of the double shielded coaxial cable 130'.

The auxiliary signal line 171 receives first signal S1 71 and delays the first signal to provide a first driving signal Ds1 171 that is time shifted version of the first signal 51 71.

The voltage buffer outputs second signal S2 72. The second signal S2 72 is fed to main shield 132.

Figure 7:
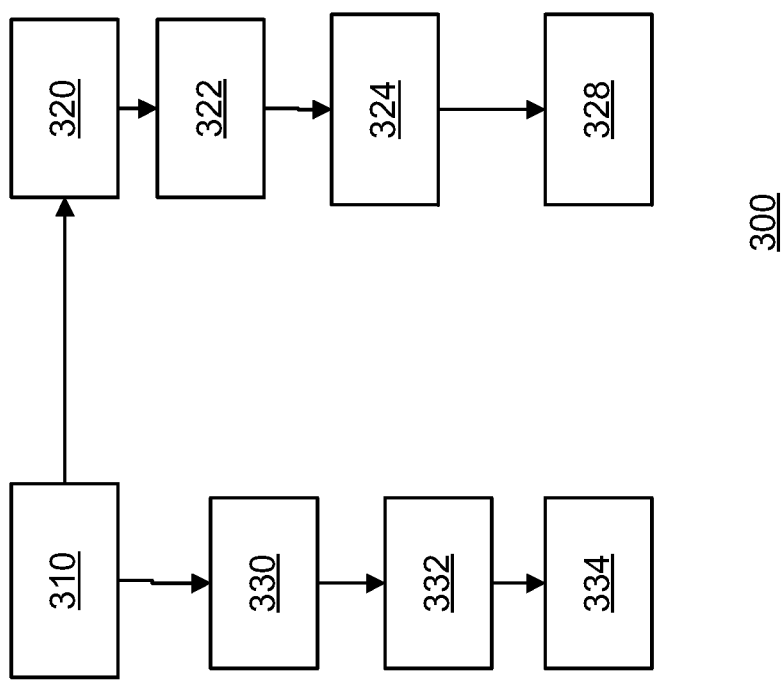
FIG. 7 illustrates an example of a method.

FIG. 7 is an example of a method 300 for driving an electrode of a charged particle beam column.

Method 300 may start by step 310 of receiving an input signal by a first amplifier and a second amplifier.

An output of the first amplifier is coupled, via a first resistor, to a signal line of a coaxial cable.

An output of the second amplifier is coupled, via a second resistor, to a main shield of the coaxial cable.

One port of the first amplifier and one port of the second amplifier are coupled to a power supply return port.

Step 310 may be followed by step 320 and step 330.

Step 320 may include amplifying the input signal by the first amplifier to provide a first signal.

Step 320 may be followed by step 322 of filtering the first signal by a first output path that includes the first resistor and the signal line to provide a first driving signal.

Step 322 may be followed by step 324 of driving the signal line by the first driving signal.

Step 324 may be followed by step 328 of feeding the electrode with the first driving signal, wherein the electrode is coupled between the signal line and the power supply return port.

Step 330 may include amplifying the input signal by the second amplifier to provide a second signal. The first amplifier and the second amplifier may have the same gain.

Step 330 may be followed by step 332 of filtering the second signal by a second output path that includes the second resistor and the main shield to provide a second driving signal.

Step 332 may be followed by step 334 of driving the main shield by the second signal.

The electrode may be a deflecting electrode and the driving of the signal line may be followed by deflecting an electron beam generated by the charged particle beam column.

The electrode may differ from a deflecting electrode.

The coaxial cable may be a double shielded coaxial cable and may include an additional shield that surrounds the main shield, the additional shield is electrically coupled to the power supply return port.

An auxiliary coaxial cable may be coupled between the first resistor and the coaxial cable.

In this case, step 322 includes filtering the first signal by a first output path that includes a first resistor, an auxiliary coaxial cable and a signal line of a coaxial cable to provide a first driving signal. The first resistor, a signal line of the auxiliary coaxial cable and the signal line of a coaxial cable may be serially coupled to each other.

Figure 8:
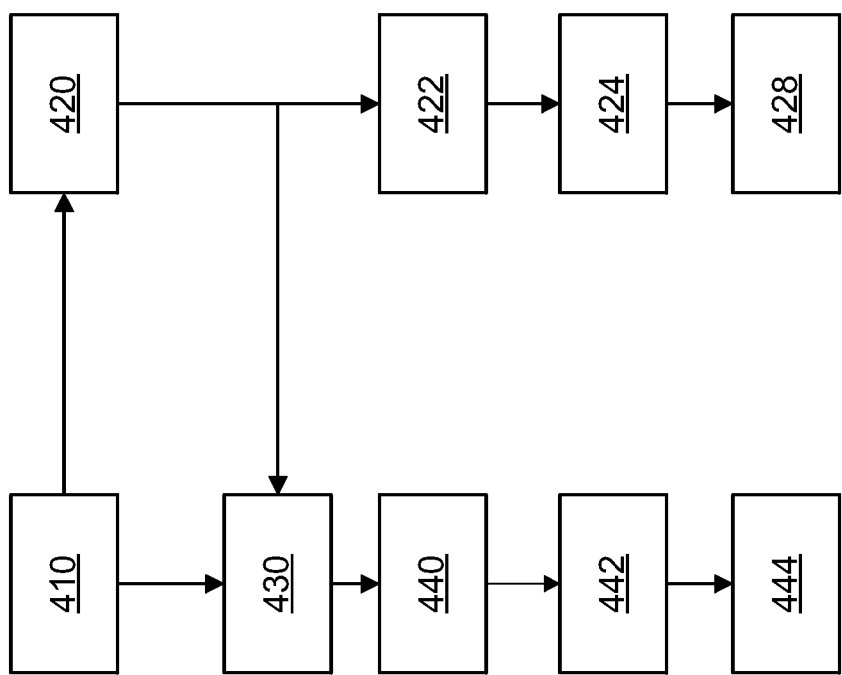
FIG. 8 illustrates an example of a method.

FIG. 8 is an example of a method 400 for driving an electrode of a charged particle beam column.

Method 400 may start by step 410 of receiving an input signal by a first amplifier. An output of the first amplifier is coupled to a signal line of a coaxial cable. One port of the first amplifier is coupled to a power supply return port.

Step 410 may be followed by step 420 of amplifying the input signal by the first amplifier to provide a first signal.

Step 420 may be also be followed by step 422 of filtering the first signal by a first output path that includes the first resistor and the signal line to provide a first driving signal.

Step 422 may be followed by step 424 of driving the signal line by the first driving signal.

Step 424 may be followed by step 428 of feeding the electrode with the first driving signal, wherein the electrode is coupled between the signal line and the power supply return port.

Step 420 may be also followed by step 430 of receiving the first signal by an input of a voltage buffer, an output of the voltage buffer is coupled to a main shield of the coaxial cable, one port of the voltage buffer is coupled to a power supply return port.

Step 430 may be followed by step 440 of outputting by the voltage buffer a second signal that equals the first signal.

Step 440 may be followed by step 442 of filtering the second signal by a second output path that includes the second resistor and the main shield to provide a second driving signal.

Step 442 may be followed by step 444 of driving the main shield by the second signal.

The coaxial cable may be a double shielded coaxial cable and may include an additional shield that surrounds the main shield, the additional shield is electrically coupled to the power supply return port.

An auxiliary coaxial cable may be coupled between the first resistor and the coaxial cable.

In this case, step 422 includes filtering the first signal by a first output path that includes a first resistor, an auxiliary coaxial cable and a signal line of a coaxial cable to provide a first driving signal. The first resistor, a signal line of the auxiliary coaxial cable and the signal line of a coaxial cable may be serially coupled to each other.

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to be a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure s containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

I claim:

1. A supply unit for driving an electrode of a charged particle beam column, the supply unit comprises:
   a first amplifier;
   a first resistor;
   a second resistor;
   a second amplifier; and
   a coaxial cable;
      wherein the first amplifier and second amplifier are configured to receive an input signal; an output of the first amplifier is coupled, via the first resistor, to a signal line of the coaxial cable; an output of the second amplifier is coupled, via the second resistor, to a main shield of the coaxial cable; one port of the first amplifier and one port of the second amplifier are coupled to a power supply return port;
      wherein the first amplifier is configured to amplify the input signal to provide a first signal;
      wherein a first output path that comprises (a) the first resistor and (b) the signal line is configured to filter the first signal to provide a first driving signal;
      wherein the second amplifier is configured to amplify the input signal to provide a second signal;
      wherein a second output path that comprises (a) the second resistor and (b) the main shield is configured to filter the second signal to provide a second driving signal, and to feed the main shield with the second driving signal;
      wherein the signal line is configured to provide the first driving signal to the electrode, the electrode is coupled between the signal line and the power supply return port.

2. The supply unit according to claim 1 wherein the electrode is a deflecting electrode and wherein a driving of the signal line is followed by deflecting an electron beam generated by the charged particle beam column.

3. The supply unit according to claim 1 wherein the electrode differs from a deflecting electrode.

4. The supply unit according to claim 1 wherein the coaxial cable comprises an additional shield that surrounds the main shield, the additional shield is electrically coupled to the power supply return port.

5. The supply unit according to claim 4 wherein the first output path further comprises an auxiliary coaxial cable coupled between the first resistor and the coaxial cable.

6. A method for driving an electrode of a charged particle beam column, the method comprising:
- receiving an input signal by a first amplifier and a second amplifier; an output of the first amplifier is coupled, via a first resistor, to a signal line of a coaxial cable; an output of the second amplifier is coupled, via a second resistor, to a main shield of the coaxial cable; one port of the first amplifier and one port of the second amplifier are coupled to a power supply return port;
- amplifying the input signal by the first amplifier to provide a first signal;
- amplifying the input signal by the second amplifier to provide a second signal;
- filtering the first signal by a first output path that comprises the first resistor and the signal line to provide a first driving signal;
- driving the signal line by the first driving signal;
- filtering the second signal by a second output path that comprises the second resistor and the main shield to provide a second driving signal;
  - feeding the second driving signal to the main shield; and
- feeding the electrode with the first driving signal, wherein the electrode is coupled between the signal line and the power supply return port.

7. The method according to claim 6 wherein the electrode is a deflecting electrode and wherein a driving of the signal line is followed by deflecting an electron beam generated by the charged particle beam column.

8. The method according to claim 6 wherein the electrode differs from a deflecting electrode.

9. The method according to claim 6 wherein the coaxial cable comprises an additional shield that surrounds the main shield, the additional shield is electrically coupled to the power supply return port.

10. The method according to claim 9 wherein the first output path further comprises an auxiliary coaxial cable coupled between the first resistor and the coaxial cable.

11. A supply unit for driving an electrode of a charged particle beam column, the supply unit comprises:
- a first amplifier;
- a first resistor;
- a second resistor;
- a voltage buffer; and
- a coaxial cable;
  - wherein the first amplifier is configured to receive an input signal; an output of the first amplifier is coupled, via the first resistor, to a signal line of the coaxial cable; an output of the voltage buffer is coupled, via the second resistor, to a main shield of the coaxial cable; one port of the first amplifier and one port of the voltage buffer are coupled to a power supply return port; an input of the voltage buffer is coupled to an output port of the first amplifier;
  - wherein the first amplifier is configured to amplify the input signal to provide a first signal;
  - wherein the voltage buffer is configured to receive the first signal and output a second signal that equals the first signal;
  - wherein the first resistor and the signal line belong to a first output path that is configured to filter the first signal to provide a first driving signal;
  - wherein the second resistor and the main shield belong to a second output path that is configured to filter the second signal to provide a second driving signal and to feed the main shield with the second driving signal; and
  - wherein the signal line is configured to provide the first driving signal to the electrode, the electrode is coupled between the signal line and the power supply return port.

12. A method for driving an electrode of a charged particle beam column, the method comprising:
- receiving an input signal by a first amplifier; an output of the first amplifier is coupled via a first resistor to a signal line of a coaxial cable; one port of the first amplifier is coupled to a power supply return port;
- amplifying the input signal by the first amplifier to provide a first signal;
- filtering the first signal by a first output path that comprises the first resistor and the signal line to provide a first driving signal;
- receiving the first signal by an input of a voltage buffer; an output of the voltage buffer is coupled via a second resistor to a main shield of the coaxial cable; one port of the voltage buffer is coupled to a power supply return port;
- outputting by the voltage buffer a second signal that equals the first signal;
- driving the signal line by the first driving signal;
- filtering the second signal by a second output path that comprises the second resistor and the main shield to provide a second driving signal;
- driving the main shield by the second driving signal; and
- feeding the electrode with the first driving signal, wherein the electrode is coupled between the signal line and the power supply return port.

* * * * *